United States Patent [19]

Hendrix et al.

[11] Patent Number: 4,802,968
[45] Date of Patent: Feb. 7, 1989

[54] RF PLASMA PROCESSING APPARATUS

[75] Inventors: Howard A. Hendrix, Morgan Hill; Howard W. Schmidt, Jr., Gilroy; Ernest S. Ward, San Jose, all of Calif.

[73] Assignee: International Business Machines Corporation, Armonk, N.Y.

[21] Appl. No.: 150,361

[22] Filed: Jan. 29, 1988

[51] Int. Cl.[4] .......................................... C23C 14/40
[52] U.S. Cl. .............................. 204/298; 204/192.12; 204/192.32; 156/345; 156/643
[58] Field of Search ...................... 204/192.12, 192.22, 204/192.32, 298; 156/345, 643

[56] References Cited

U.S. PATENT DOCUMENTS

| | | | |
|---|---|---|---|
| 3,369,991 | 2/1968 | Davidse et al. | 204/298 |
| 3,617,459 | 11/1971 | Logan | 204/192.23 |
| 3,714,019 | 1/1973 | Orris | 204/298 |
| 3,749,662 | 7/1973 | Biehl | 204/298 |
| 4,131,533 | 12/1978 | Bialko et al. | 204/298 |
| 4,170,541 | 10/1979 | Lamont, Jr. | 204/298 |
| 4,362,611 | 12/1982 | Logan et al. | 204/298 |
| 4,399,016 | 8/1983 | Tsukada et al. | 156/643 |
| 4,422,897 | 12/1983 | Horwitz | 156/643 |
| 4,576,700 | 3/1986 | Kadokura et al. | 204/192.15 |
| 4,647,361 | 3/1987 | Bauer | 204/298 |
| 4,661,233 | 4/1987 | Glasser | 204/298 |

FOREIGN PATENT DOCUMENTS 59-217324 12/1984 Japan .................................. 204/298

Primary Examiner—Aaron Weisstuch
Attorney, Agent, or Firm—Otto Schmid, Jr.

[57] ABSTRACT

A sputtering apparatus for coating a substrate comprising a first electrode for supporting a suitable target material and a second electrode for supporting a substrate, upon which a coating is deposited. A source of RF power is connected to impose an RF voltage across the electrodes to produce a glow discharge in the space between the electrodes. A shield is provided surrounding the peripheral edges and the back of the second electrode, and this shield is spaced a substantial distance from the back of the electrode. Electrical insulating material is placed in the space between the shield and the back of the second electrode with a small gap between the electrical insulating material and the shield. The configuration of the shield, the insulating material, and the second electrode eliminates spurious sputtering from the peripheral and back regions of the second electrode so that very high power levels can be achieved and sputtering can be done very efficiently at high sputtering rates.

8 Claims, 3 Drawing Sheets

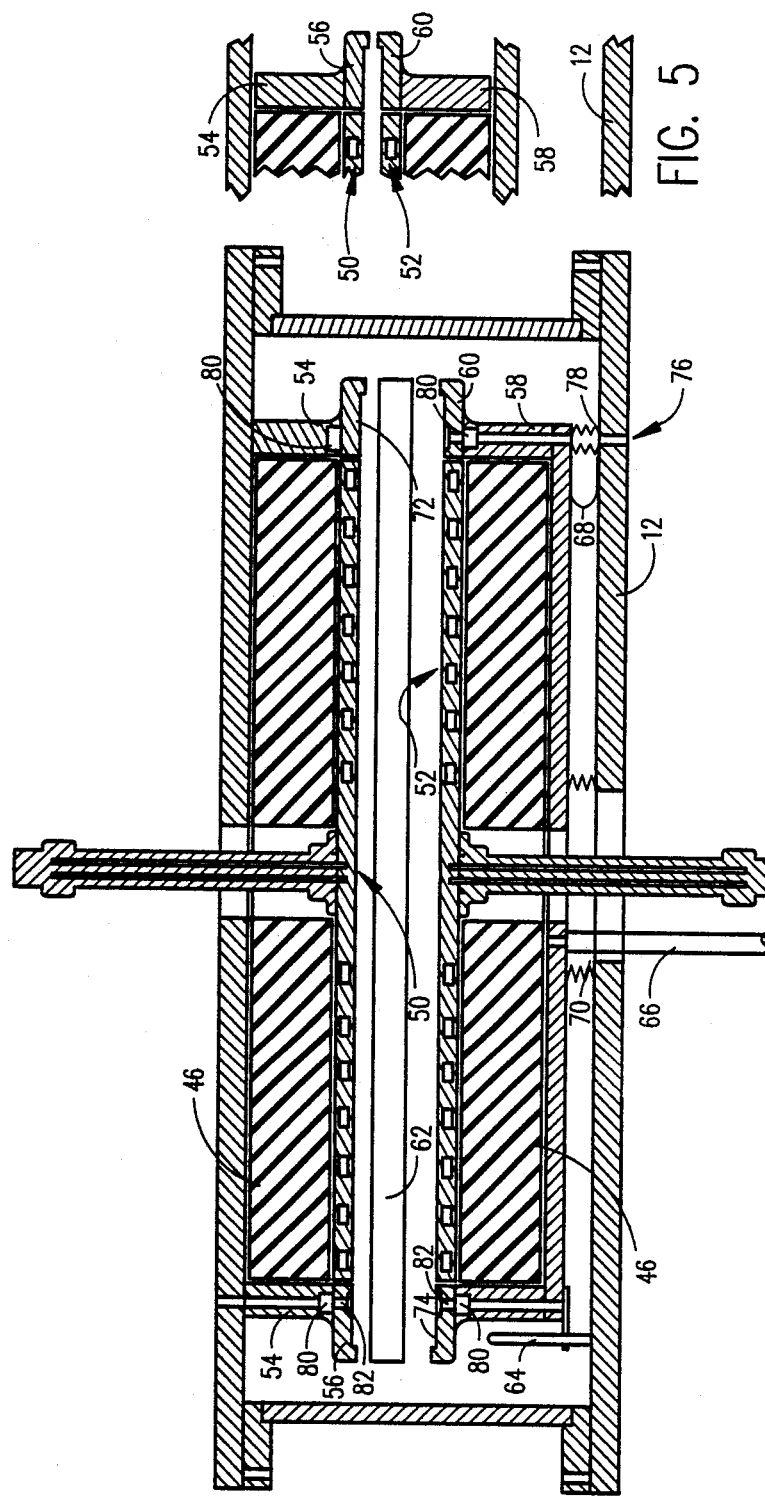

RF PLASMA PROCESSING APPARATUS

BACKGROUND OF THE INVENTION

1. Field of the Invention

The invention relates to RF plasma processing apparatus, and more particularly to improved apparatus for RF sputtering deposition and etching of dielectrics and/or metals.

2. Description of the Prior Art

The fundamental process of sputtering, involving exposure of the material to be sputtered to bombardment of ions in a suitable pressure gaseous glow discharge and thereby causing the material to be impact-eroded and deposited upon an object to be coated, is known in the art. The sputtering of metallic substances can be accomplished by employing either direct-current excitation as disclosed in U.S. Pat. No. 4,576,700 to Kadokura et al, or radio frequency (RF) alternating-current excitation applied to the metal target electrode as disclosed in commonly assigned U.S. Pat. No. 4,647,361.

The successful application of the basic process of sputtering to dielectric materials, requiring the application of only RF alternating-current excitation to a metal electrode that adjoins the dielectric target, also is known in the art as disclosed in commonly assigned U.S. Pat. No. 3,617,459 to Logan and in U.S. Pat. No. 4,399,016 to Tsukada et al.

The fundamental process can also be used for selectively etching materials by the use of an RF voltage to form the plasma, in conjunction with an etchant gas as disclosed in U.S. Pat. No. 4,422,897 to Horwitz.

There has been an effort to increase both sputtering efficiency and sputtering productivity in systems with low-yield sputter materials $Al_2O_3$, for example) and the necessity to maintain substrate temperature below 100° C., but these efforts have met with limited success up to the present. For example, an increase in the size of the electrodes to increase the batch capacity resulted in a decrease in the RF impedance to ground, thereby lowering the sputtering efficiency. The above-mentioned Logan et al patent discloses a variable impedance which can be tuned to enhance the sputtering quality by controlled resputtering during deposition. However, there is a limitation as to the resputtering voltages attainable at the substrate within such prior art systems.

The prior art has not shown a plasma processing apparatus which exhibits a wide range of resputtering, substantially improved RF power transfer to the plasma, and increased sputtering productivity simultaneously. In addition, the prior art has not shown a plasma processing apparatus which exhibits both high sputtering efficiency and substantial improvement in the deposition/etch uniformity across a large batch of substrates.

SUMMARY OF THE INVENTION

It is therefore the principal object of this invention to provide a plasma processing apparatus which exhibits high sputtering efficiency, optimum RF power transfer to the plasma, and increased sputtering productivity.

It is an object of this invention to provide a plasma processing apparatus which produces a wide range of resputtering voltages for improved sputtered film quality.

In accordance with the invention, the plasma processing apparatus comprises a first electrode and a target of a suitable material supported on the first electrode. A second electrode has supported on its front face a substrate which is positioned adjacent to and in alignment with the target electrode. A source of RF power is coupled across the electrodes to produce a glow discharge in the space between the electrodes. Shield means surrounds the peripheral and back surfaces of the second electrode with the shield being spaced from the back surface of the electrode to form a back space. The back space is substantially filled with electrically insulating material with the exception that the insulating material is spaced a small substantially uniform distance from the back surface of the electrode and the shield means to produce a maximum RF impedance to ground while at the same time preventing spurious sputtering from the peripheral and back regions of the second electrode.

The foregoing and other objects, features and advantages of the invention will be apparent from the following more particular description of a preferred embodiment of the invention as illustrated in the accompanying drawing(s).

BRIEF DESCRIPTION OF THE DRAWINGS

FIG. 4 is a cross-section view of a specific embodiment of the electrode assemblies of the sputtering apparatus embodying the present invention.

FIG. 5 is a partial cross-section view of the sputtering apparatus of FIG. 4 with the electrode assemblies in an alternate position.

DESCRIPTION OF THE PREFERRED EMBODIMENT

The present invention will be described as being embodied in sputter deposition apparatus although it will be recognized by those skilled in the art that the same basic structure can be used for sputter on plasma etching with small changes.

Figure 1:
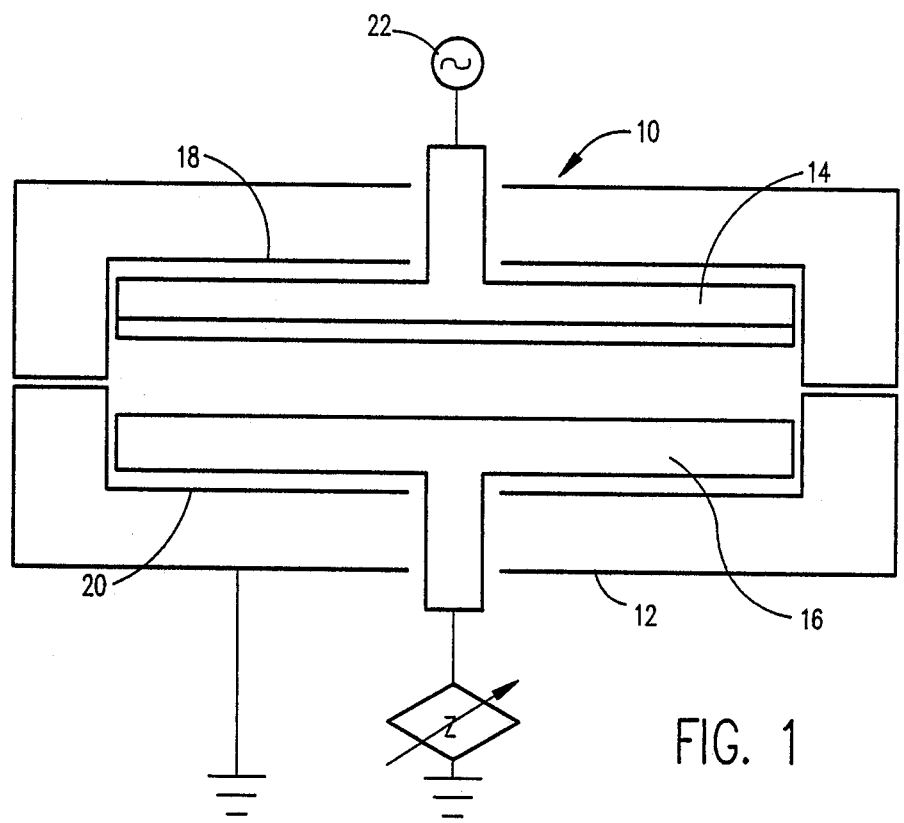
FIG. 1 is a schematic view showing the general arrangement of the elements and the power supply of the plasma processing apparatus of the invention.

Referring to FIG. 1, the general structure of the electrode assemblies and the power supply is shown for the sputtering apparatus according to the present invention. The sputtering apparatus 10 of the invention comprises a vacuum enclosure 12 and a vacuum pump (not shown) to evacuate the sputtering enclosure to a desired background pressure level. A suitable gas such as argon, for example, is then fed into the enclosure to provide the necessary background environment for sputter deposition.

A target electrode assembly 14 to which a target body is mounted is positioned within the enclosure 12, and a substrate electrode assembly 16 is positioned adjacent to and facing the target electrode assembly 14. The electrode assemblies 14 and 16 may be water cooled to maintain a desired temperature during operation. To eliminate spurious sputtering that may occur at the back of the electrode assemblies 14 and 16, each electrode assembly 14 and 16 has a ground shield 18 and 20, respectively, surrounding the peripheral and back portions of the electrode assembly thereby leaving the face of the electrode assemblies exposed for supporting target bodies and substrates to be coated.

The power supply 22 is connected to supply an RF voltage potential across target electrode assembly 14 and substrate electrode assembly 16 and variable impedance 24. The capacitive and inductive components of variable impedance 24 can be varied to control the voltage to substrate electrode assembly 16 to provide control over the properties of the films deposited by the sputtering apparatus.

According to the present invention, a novel structure for the target electrode assembly 14 and the substrate electrode assembly 16, which will be described in detail below, enables the sputtering apparatus to be operated with high power density and high sputtering efficiency so that a high deposition rate can be achieved with the result that less time and less expense is incurred during mass production.

Figure 2:
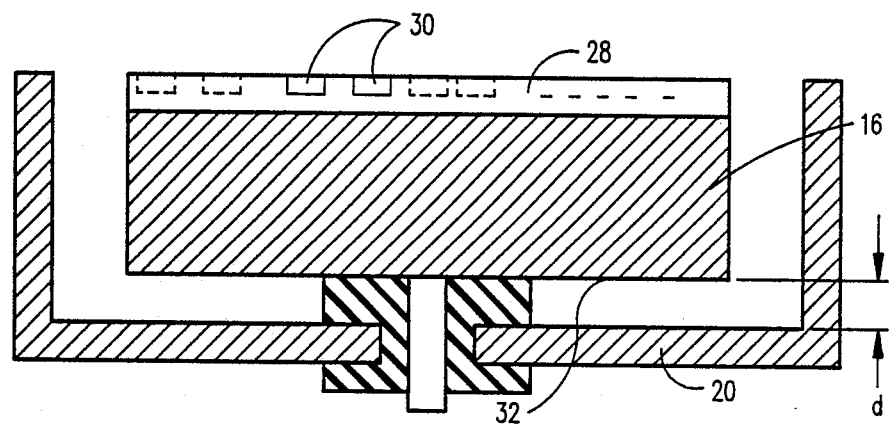
FIG. 2 is a cross-section showing a schematic view of the substrate electrode assembly according to the prior art.

The structure of a typical prior art substrate electrode assembly 16 is shown schematically in FIG. 2. The substrate electrode assembly 16 comprises substrate electrode 26 which is adapted to support a substrate holder 28 mounted on one of its faces. Substrate holder 28 is designed to hold a plurality of substrates 30 to be coated with a chosen material in the sputtering apparatus 10.

In accordance with the object of the present invention to provide increased sputtering efficiency, one way of accomplishing this object is to increase the power density in the sputtering plasma by more efficient transfer of RF power applied across the electrode assemblies. In accordance with the object of the present invention to increase the sputtering productivity this object can be accomplished by increasing the size of the substrate electrode 26. However, these enhancements to the operation of a sputtering apparatus cannot be achieved by the use of the prior art substrate electrode structure for the following reasons.

The capacitance C of the substrate electrode 26 structure is proportional to the area A of the back surface 32 of the substrate electrode 26 divided by the distance d between the back surface 32 of the substrate electrode and the adjacent ground shield 20. The impedance is proportional to 1/C. Should the diameter of the substrate electrode 26 be increased by a factor of 50%, for example, then the area A would increase by a factor greater than 2, and the impedance would be less than one-half the original impedance. This lower impedance would not produce a higher deposition rate but, in contrast, would lead to shunting of a larger amount of the power across the gap between substrate electrode 26 and the adjacent ground shield 20. This shunted power lowers the overall sputtering efficiency.

Figure 3:
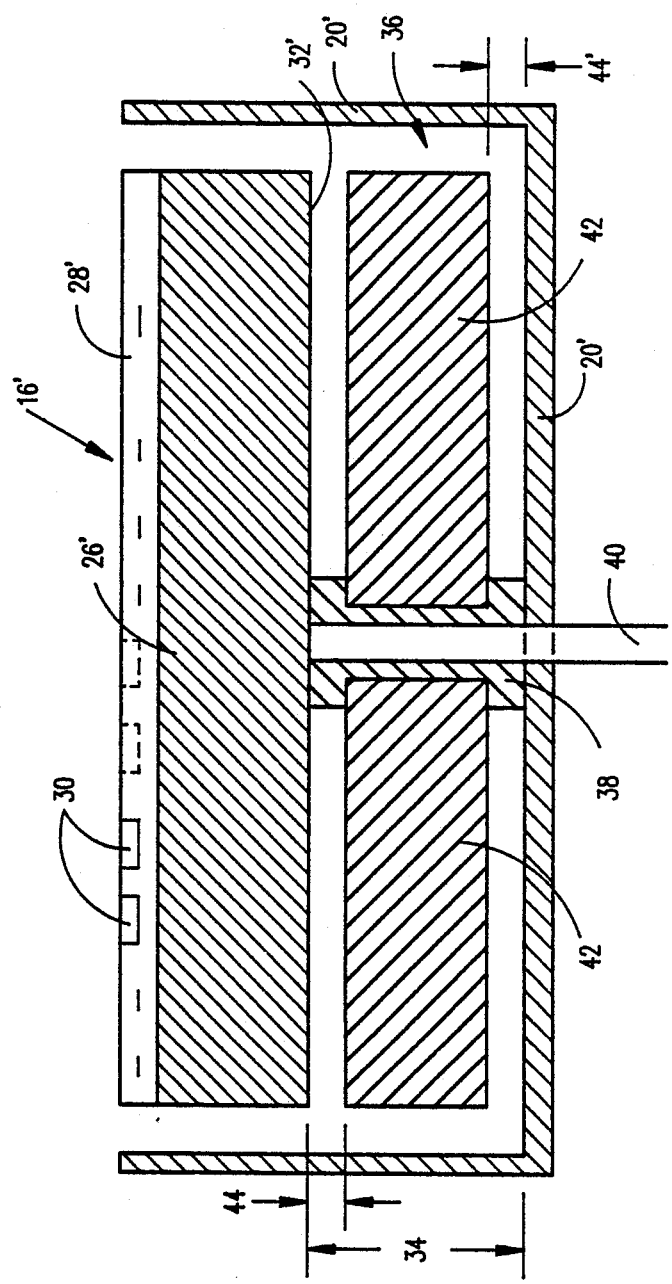
FIG. 3 is a cross-section showing a schematic view of the substrate electrode assembly according to the present invention.

In accordance with the present invention, the novel structure of the substrate electrode assembly 16' is shown schematically in FIG. 3. The substrate electrode assembly 16' comprises a substrate electrode 26' which is adapted to have a substrate holder 28' mounted on one of its faces. Substrate holder 28' is designed to hold a large number of substrates 30 to be coated with a chosen material in the sputtering apparatus 10.

According to one feature of the present invention, the ground shield 20' is spaced a substantial distance from the back surface 32' of the substrate electrode 26' to form a back space 34. Back space 34 is substantially filled with insulating means 36 such as a suitable ceramic material, for example, for electrically insulating ground shield 20 from the substrate electrode 26'. The specific configuration of insulating means 36 is important to the operation of the sputtering apparatus 10 and to the achievement of the objects of the present invention.

The insulating means 36 comprises a feed through insulator 38 which surrounds the RF voltage conductor 40 which leads to and is electrically and mechanically connected to the substrate electrode 26'. Doughnut-shaped insulator 42 is captured upon insulator 38. Insulator 42 is shaped to fill the back space 34 with the exception that insulator 42 is spaced a small substantially uniform distance from the back surface 32 of the substrate electrode 26' and the ground shield 20' to form gaps 44 and 44', respectively. This design has the advantage that the capacitance is greatly decreased due the equivalent circuit of three capacitances in series. The first capacitance is produced by the first gap 44, the second capacitance by the insulator 42 and the third capacitance by the second gap 44'. In a specific embodiment the capacitance was 1/5 of the capacitance of the embodiment shown in FIG. 2 with the result that the impedance was 5 times higher. This increase in impedance greatly increases the sputtering efficiency.

The width of gap 44 is critical to the operation of the sputtering apparatus. The gap 44 must be smaller than the Crookes dark space in the glow discharge. Should the gap be larger than the Crookes dark space, then unwanted sputtering across gap 44 would occur. On the other hand, should the gap be too small, the gap would appear, during evacuation of the vacuum enclosure 12, as a virtual leak thereby adversely affecting the operation of the sputtering apparatus 10. An additional adverse operation occurs when gap 44 is too small, and this is related to RF current conduction as a surface current to ground.

A specific embodiment of the sputtering apparatus embodying the present invention is shown in FIG. 4. In this embodiment, an insulator 46 is present in the back space of both the target electrode assembly 50 and the substrate electrode assembly 52. The ground shield 54 for the target electrode assembly 50 is provided with an annular ground shield extension member 56. The ground shield 58 for the substrate electrode assembly 52 is provided with an annular ground shield extension member 60.

In operation, the substrates are loaded and thermally bonded onto the substrate holder, and the sputtering apparatus is pumped down to a suitable vacuum such as $10^{-6}$ to $10^{-7}$ torr, for example. After the desired pressure is reached and the apparatus is tested to insure that the vacuum integrity is normal, the sputtering apparatus is backfilled with a suitable gas such as Argon to a suitable pressure in the range of 2–30 microns. The shutter 62 is then positioned between the electrodes by moving the shutter from its plenum in a plane normal to the plane of the paper of FIG. 4. The shutter is at ground potential during the cleaning mode, and the RF potential is coupled to the target to sputter clean the target for deposition on the top surface of the shutter. The RF voltage is then coupled to the substrate electrode for surface cleaning or etching of the surface to a chosen amount. This material is deposited on the bottom surface of the shutter. After the cleaning operation is completed, the shutter 62 is retracted to its resident plenum.

The target electrode assembly 50 and the substrate electrode assembly 52 then have their relative positions changed so that the ground shield extension members 56 and 60 are in close proximity to each other as shown in FIG. 5. This is accomplished in the illustrated embodiment by moving the substrate electrode assembly vertically on a plurality of guide rods 64 and 66. A plurality of conductive straps 68 maintains electrical contact between ground shield 58 and the vacuum enclosure 12. A bellows member 70 is provided to permit movement of the substrate electrode assembly 52 without breaking the vacuum integrity of the sputtering apparatus.

The ground shield extension members 56 and 60 in conjunction with the variable impedance 24 provide another feature of the present invention. The ratio of peripheral areas of surfaces 72 and 74 to the area of the substrate and electrode surfaces gives a particular point of operation which causes more or less RF power to be coupled into the substrate electrode circuit. Superimposed on this control is that provided by the variable impedance 24. The combination of these two control factors produces a wide variety of RF voltage available at the substrate electrode thereby giving a wide range for deposited film-quality control.

In another feature of the invention, the means for introducing gas into the vacuum enclosure 12 comprises gas entrance port 76 through which gas such as argon, for example, is fed to bellows member 78 and then to a circumferential ring-shaped space 80. Circumferential ring-shaped space 80 intersects with a plurality of spaced openings 82. Openings 82 serve a dual purpose as both the clearance holes for the fastening devices which hold shield extension members 56 and 60 to their associated ground shield 54 and 58, and also as a port for distribution of the gas around the shank of the fastening devices and through ports provided around the heads of the fastening devices. This arrangement provides a uniform distribution of the gas to the enclosed space between the ground shield extension members 56 and 60 and electrodes assemblies 50 and 52.

The apparatus can also be used as a reactive ion etching system by using only the substrate electrode assembly and the use of a suitable etchant gas such as $SF_6$ or $CF_4$, for example. In this case, a cylindrical shield is used to enclose the area opposite the substrate electrode assembly.

While the invention has been particularly shown and described with reference to a preferred embodiment thereof, it will be understood by those skilled in the art that various other changes in the form and details may be made therein without departing from the spirit and scope of the invention.

Having thus described our invention, what we claim as new, and desire to secure by Letters Patent is:

1. Sputtering apparatus for coating a substrate comprising:
   a first electrode and means for supporting a target member of a suitable material on said first electrode;
   a second electrode having a front portion, peripheral portions and a back portion and means for supporting on said front portion a substrate positioned adjacent to and in alignment with said first electrode;
   a source of RF power arranged to impose an RF voltage across said first and said second electrodes to produce a glow discharge in the space between said first and said second electrodes;
   shield means surrounding said peripheral and said back portions of said second electrode, said shield means being spaced from said back region of said second electrode to form a back space, said back space being substantially filled with means for electrically insulating said shield means from said second electrode, said means for electrically insulating being spaced a small substantially uniform distance from said shield means whereby maximum RF impedance to ground is provided and spurious sputtering is eliminated from said peripheral and said back regions of said second electrode.

2. The sputtering apparatus of claim 1 wherein said small substantially uniform distance by which said means for electrically insulating is spaced from said shield means is less than the Crookes dark space of said glow discharge.

3. Sputtering apparatus for coating a substrate comprising:
   a first electrode having a front portion, peripheral portions and a back portion and means for supporting on said front portion a target member of a suitable material;
   a second electrode having a front portion, peripheral portions and a back portion and means for supporting on said front portion a substrate positioned adjacent to and in alignment with said first electrode;
   a source of RF power arranged to impose an RF voltage across said first and said second electrodes to produce a glow discharge in the space between said first and said second electrodes;
   shield means surrounding said peripheral and said back portions of said first and said second electrodes, each said shield means being spaced from said back region of each of said electrodes to form respective back spaces, said back spaces being substantially filled with means for electrically insulating said shield means from the resepctive electrode, said means for electrically insulating being spaced a small substantially uniform distance from said shield means whereby maximum RF impedance to ground is provided and spurious sputtering is eliminated from said peripheral and said back regions of said first and said second electrodes.

4. The sputtering apparatus of claim 3 wherein said small substantially uniform distance by which said means for electrically insulating is spaced from said shield means is less than the Crookes dark space of said glow discharge.

5. Sputtering apparatus for coating a substrate comprising:
   a vacuum enclosure;
   a first electrode comprising a front portion having a predetermined area, peripheral portions and a back portion and means for supporting a target member of a suitable material on said front surface of said first electrode;
   a second electrode comprising a front portion having a predetermined area, peripheral portions and a back portion and means for supporting on said front portion at least one substrate positioned adjacent to and in alignment with said first electrode;
   means for introducing a gas into said vacuum enclosure;
   a source of RF power connected in a circuit path to impose an RF voltage across said first and said second electrodes to produce a glow discharge in the space between said first and said second electrodes;

first shield means surrounding said peripheral and back portions of said first electrode;

second shield means surrounding said peripheral and said back portions of said second electrode, said shield means being spaced from said back region of each of said first and said second electrodes to form a back space, said back space being substantially filled with means for electrically insulating said shield means from said first and said second electrodes, said means for electrically insulating being spaced a small substantially uniform distance from said shield means;

a variable impedance and means for connecting said variable impedance in the circuit path which includes said source of RF power and said first and second electrodes;

first shield extension member and means for attaching said first shield extension means to said first shield means, said first shield extension means comprising a surface having a predetermined area which extends away from said first electrode;

a second shield extension member and means for attaching said second shield extension member to said second shield means, said second shield extension means comprising a surface having a predetermined area which extends away from said second electrode; and means to position said electrodes so that said surfaces of said shield extension means are in close proximity to each other whereby the combination of the ratio between the areas of said surfaces of said shield extension members and the area of said electrodes and said variable impedance set the operating point of said sputtering apparatus.

6. The sputtering apparatus of claim 5 wherein said small substantially uniform distance by which said means for electrically insulating is spaced from said shield means is less than the Crookes dark space of said glow discharge.

7. The sputtering apparatus of claim 5 wherein said shield extension means additionally comprise a plurality of spaced openings and wherein said means for introducing gas into said chamber comprises means for introducing gas through said spaced openings whereby a uniform distribution of gas is produced in the area enclosed by said shield extension means and said electrodes.

8. The sputtering apparatus of claim 7 wherein said means for introducing gas is adapted to introduce argon into said vacuum enclosure.

* * * * *